US008859417B2

(12) United States Patent
Yu et al.

(10) Patent No.: US 8,859,417 B2
(45) Date of Patent: Oct. 14, 2014

(54) GATE ELECTRODE(S) AND CONTACT STRUCTURE(S), AND METHODS OF FABRICATION THEREOF

(71) Applicant: GLOBALFOUNDRIES, Inc., Grand Cayman (KY)

(72) Inventors: Jialin Yu, Malta, NY (US); Huang Liu, Mechanicville, NY (US); Jilin Xia, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/733,282

(22) Filed: Jan. 3, 2013

(65) Prior Publication Data

US 2014/0183745 A1  Jul. 3, 2014

(51) Int. Cl.
| | |
|---|---|
| H01L 21/4763 | (2006.01) |
| H01L 23/52 | (2006.01) |
| H01L 23/48 | (2006.01) |
| H01L 29/40 | (2006.01) |
| H01L 29/45 | (2006.01) |

(52) U.S. Cl.
CPC .............. H01L 29/401 (2013.01); H01L 29/45 (2013.01)
USPC .......................................... 438/629; 257/763

(58) Field of Classification Search
USPC ................ 257/751, 763; 438/98, 625–658
See application file for complete search history.

(56) References Cited

U.S. PATENT DOCUMENTS

| | | | |
|---|---|---|---|
| 4,749,597 A | 6/1988 | Mendonca et al. |
| 4,774,201 A | 9/1988 | Woo et al. |
| 4,961,822 A | 10/1990 | Liao et al. |
| 4,966,869 A | 10/1990 | Hillman et al. |
| 4,987,099 A | 1/1991 | Flander |
| 5,028,565 A | 7/1991 | Chang et al. |
| 5,071,788 A | 12/1991 | Joshi |
| 5,073,645 A | 12/1991 | Kruck et al. |
| 5,212,400 A | 5/1993 | Joshi |
| 5,342,652 A | 8/1994 | Foster et al. |
| 5,346,719 A | 9/1994 | Zarnoch et al. |
| 5,370,739 A | 12/1994 | Foster et al. |
| 5,385,751 A | 1/1995 | Riaz et al. |
| 5,434,110 A | 7/1995 | Foster et al. |
| 5,468,298 A | 11/1995 | Lei et al. |
| 5,795,824 A | 8/1998 | Hancock |

(Continued)

OTHER PUBLICATIONS

"Tungsten Plug Issues and 32 nm Process", RMG and Associates—Semicondcutor & Patent Expert Consulting, 4 pages (2008).

*Primary Examiner* — Matthew W Such
*Assistant Examiner* — Monica D Harrison
(74) *Attorney, Agent, or Firm* — Kevin P. Radigan, Esq.; Heslin Rothenberg Farley & Mesiti P.C.

(57) ABSTRACT

A conductive structure(s), such as a gate electrode(s) or a contact structure(s), and methods of fabrication thereof are provided. The conductive structure(s) includes a first conductive layer of a first conductive material, and a second conductive layer of a second conductive material. The second conductive layer is disposed over the first conductive layer, and at least a portion of the first conductive material includes grains having a size larger than a defined value, and at least a second portion of the second conductive material includes grains having a size less than the defined value. In one embodiment, the first and second conductive materials are the same conductive material, with different-sized grains.

20 Claims, 14 Drawing Sheets

(56) References Cited

U.S. PATENT DOCUMENTS

| | | | |
|---|---|---|---|
| 5,804,249 | A | 9/1998 | Sukharev et al. |
| 5,855,689 | A | 1/1999 | Akiyama |
| 5,963,828 | A | 10/1999 | Allman et al. |
| 6,030,893 | A | 2/2000 | Lo et al. |
| 6,037,263 | A | 3/2000 | Change |
| 6,048,794 | A | 4/2000 | Chen et al. |
| 6,066,366 | A | 5/2000 | Berenbaum et al. |
| 6,093,645 | A | 7/2000 | Ameen et al. |
| 6,110,826 | A | 8/2000 | Lou et al. |
| 6,127,269 | A | 10/2000 | Liaw et al. |
| 6,184,130 | B1 | 2/2001 | Ku et al. |
| 6,227,744 | B1 | 5/2001 | Fodrocy et al. |
| 6,265,312 | B1 | 7/2001 | Sidhwa et al. |
| 6,297,152 | B1 | 10/2001 | Itoh et al. |
| 6,309,966 | B1 | 10/2001 | Govindarajan et al. |
| 6,358,844 | B1 | 3/2002 | Wang et al. |
| 6,429,126 | B1 | 8/2002 | Herner et al. |
| 6,451,677 | B1 | 9/2002 | Lu et al. |
| 6,905,543 | B1 | 6/2005 | Fair et al. |
| 7,005,372 | B2 * | 2/2006 | Levy et al. .................. 438/627 |
| 7,022,601 | B2 * | 4/2006 | Jung et al. .................. 438/627 |
| 7,211,144 | B2 | 5/2007 | Lu et al. |
| 7,262,125 | B2 | 8/2007 | Wongsenakhum et al. |
| 7,589,017 | B2 | 9/2009 | Chan et al. |
| 7,595,263 | B2 | 9/2009 | Chang et al. |
| 7,605,083 | B2 | 10/2009 | Lai et al. |
| 7,611,990 | B2 | 11/2009 | Yoon et al. |
| 7,665,567 | B2 | 2/2010 | Kosugi |
| 7,691,749 | B2 | 4/2010 | Levy et al. |
| 7,695,563 | B2 | 4/2010 | Lu et al. |
| 7,732,327 | B2 | 6/2010 | Lee et al. |
| 7,745,329 | B2 | 6/2010 | Wang et al. |
| 7,745,333 | B2 | 6/2010 | Lai et al. |
| 7,745,935 | B2 * | 6/2010 | Beyer et al. .................. 257/751 |
| 7,749,815 | B2 | 7/2010 | Byun |
| 7,754,604 | B2 | 7/2010 | Wongsenakhum et al. |
| 7,754,908 | B2 | 7/2010 | Reuter et al. |
| 7,772,114 | B2 | 8/2010 | Chan et al. |
| 7,790,590 | B2 | 9/2010 | Gonobe et al. |
| 7,867,914 | B2 | 1/2011 | Xi et al. |
| 7,955,972 | B2 | 6/2011 | Chan et al. |
| 7,964,505 | B2 | 6/2011 | Khandelwal et al. |
| 8,048,805 | B2 | 11/2011 | Chan et al. |
| 8,053,365 | B2 | 11/2011 | Humayun et al. |
| 8,058,170 | B2 | 11/2011 | Chandrashekar et al. |
| 8,062,977 | B1 | 11/2011 | Ashtiani et al. |
| 8,101,521 | B1 | 1/2012 | Gao et al. |
| 8,207,062 | B2 | 6/2012 | Gao et al. |
| 8,329,576 | B2 | 12/2012 | Chan et al. |
| 2010/0273327 | A1 | 10/2010 | Chan et al. |

* cited by examiner

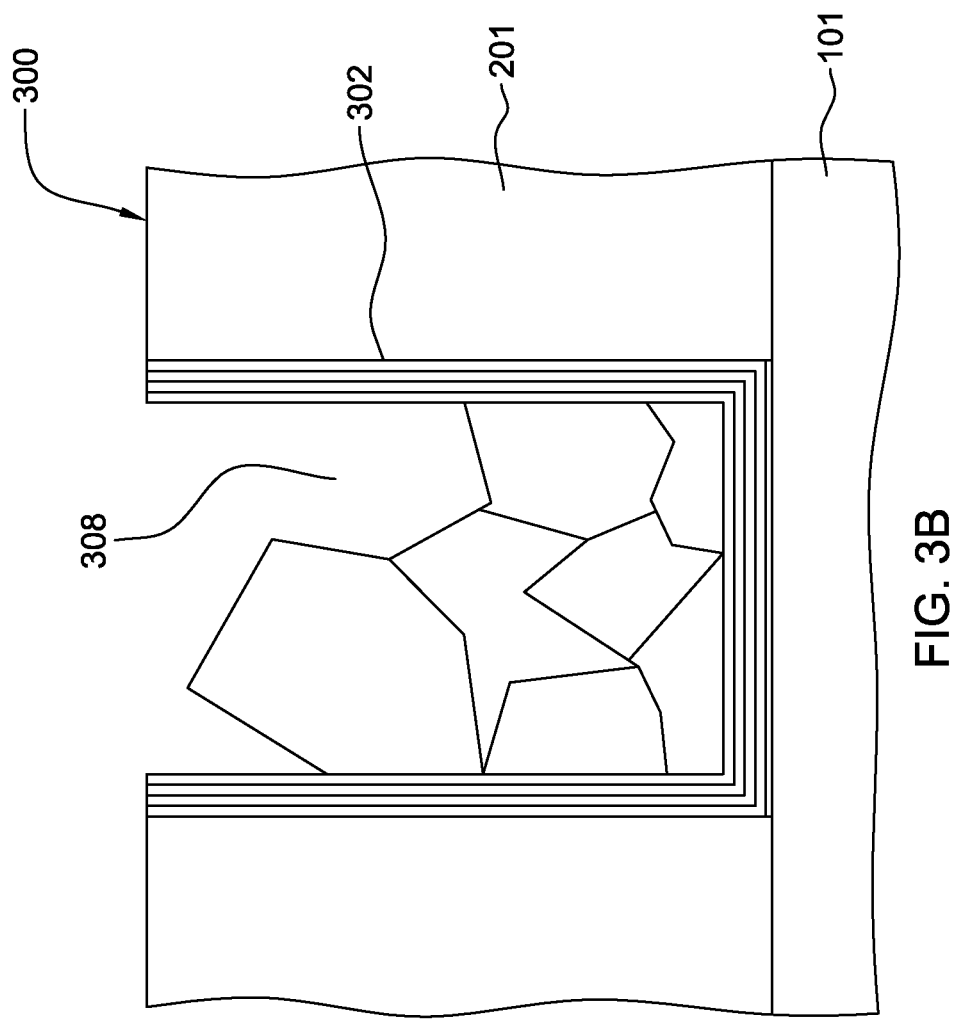

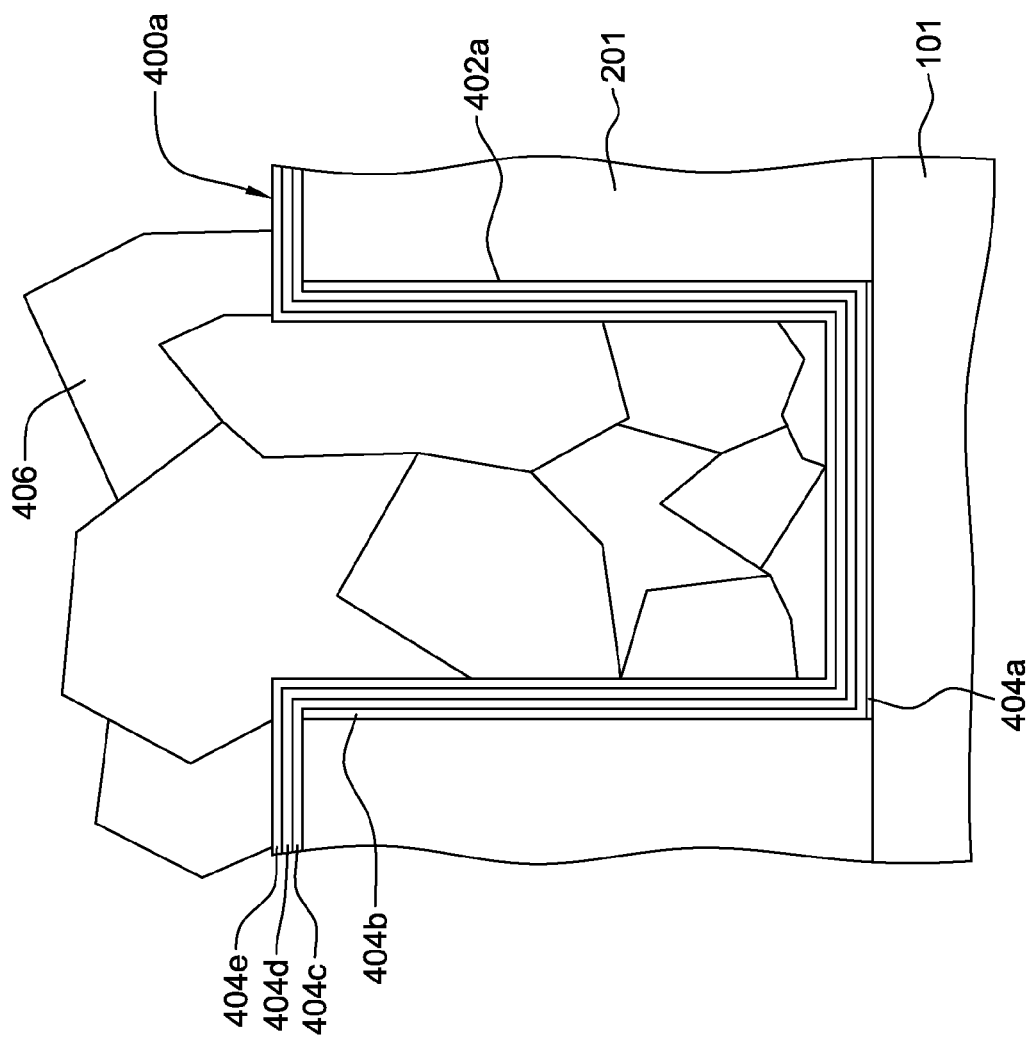

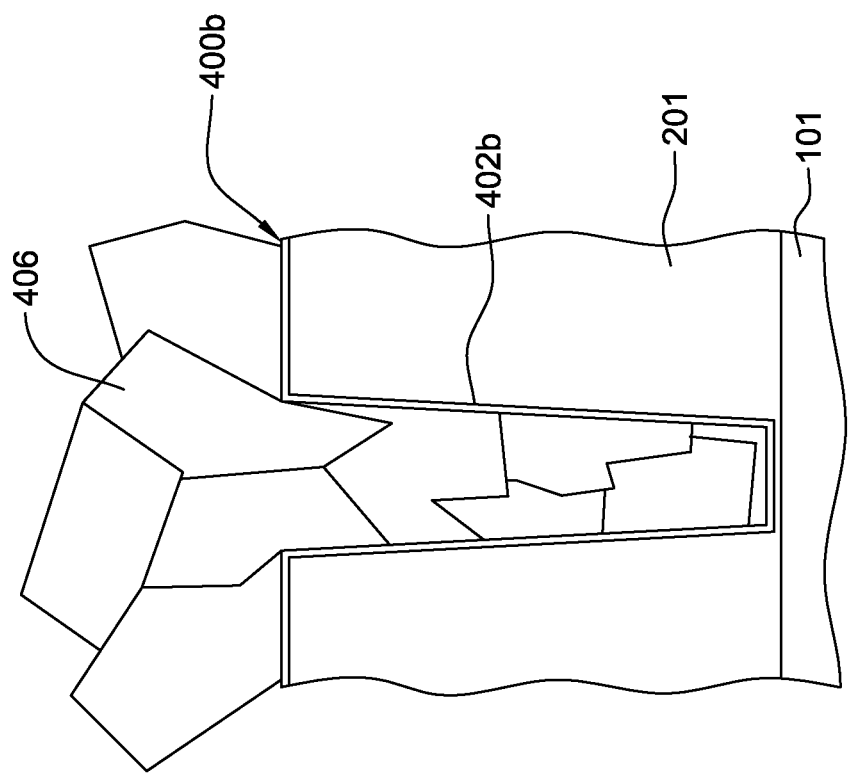

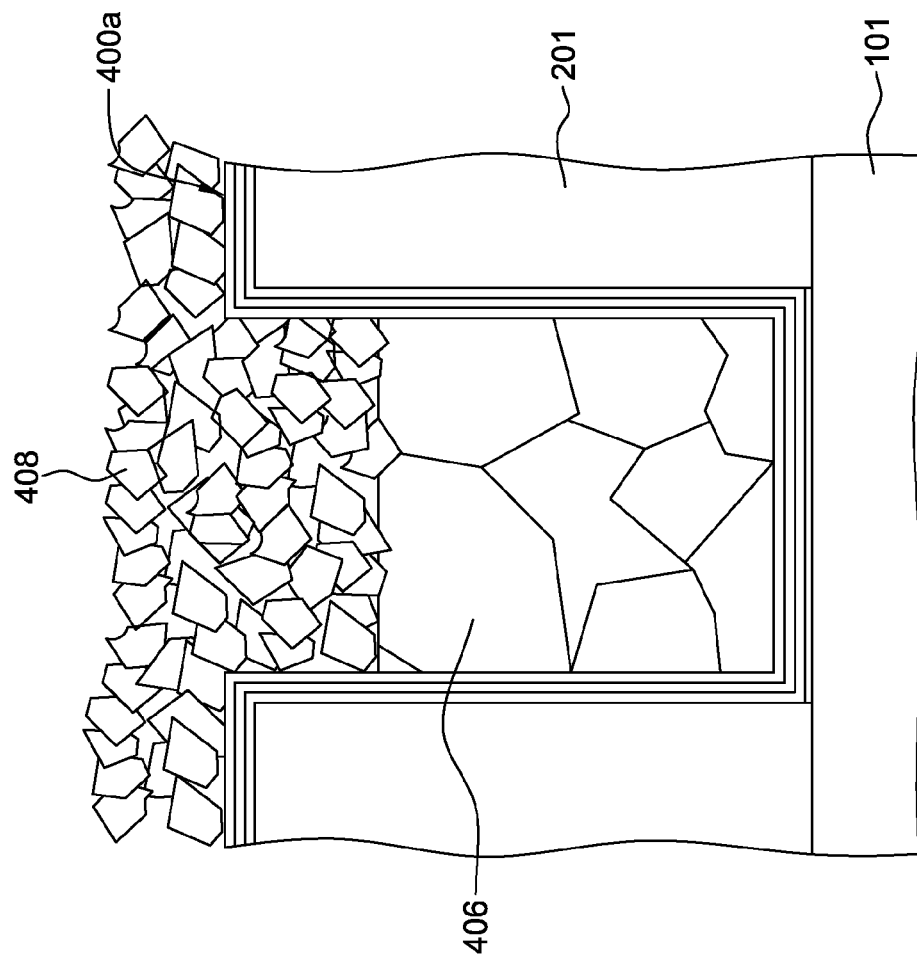

GATE ELECTRODE(S) AND CONTACT STRUCTURE(S), AND METHODS OF FABRICATION THEREOF

FIELD OF THE INVENTION

The present invention relates generally to conductive circuits and methods of fabricating conductive circuits, and more particularly, to methods of fabricating gate electrodes and/or contact structures.

BACKGROUND OF THE INVENTION

One significant phase of conductive circuit manufacturing involves a process of depositing a conductive material into an opening in an intermediate circuit structure, for instance, to facilitate forming a gate electrode or a contact structure. This process being often referred to as contact or gate metallization. Known processes for contact or gate metallization have several deficiencies sometimes resulting in a poor quality of the product.

Accordingly, a need exists for an enhanced process of fabrication of gate and/or contact structures of conductive devices.

SUMMARY OF THE INVENTION

There is provided, in a first aspect, a method of forming of a gate or contact structure of a conductive circuit. The method can comprise: forming an opening within a circuit structure, the circuit structure comprising one or more layers over a substrate; depositing a first conductive material within the opening, at least a first portion of the deposited first conductive material comprising grains of a size larger than a defined value; removing a part of the first conductive material from within the opening; and depositing a second conductive material within the opening over the first conductive material, at least a second portion of the deposited second conductive material comprising grains of a size less than the defined value.

In some embodiments, the conductive structure can comprise a gate electrode or a contact structure.

In some embodiments, the first portion can be at least 50%, 70%, or 90%.

In some embodiments, the second portion can be at least 50%, 70%, or 90%.

In some embodiments, the size of a grain can be defined as the radius of the minimum sphere that fully contains the grain. Alternatively, the size of a grain can be defined as the size of the edge of the minimum cube that fully contains the grain, or as the smallest dimension of the grain, or as the median dimension of the grain, or as the largest dimension of the grain.

In some embodiments, the defined value can be at least 80 nm, 90 nm, or 100 nm.

In some embodiments, at least one of the first conductive material or the second conductive material can comprise tungsten.

In some embodiments, the first conductive material and the second conductive material can comprise the same conductive material.

In some embodiments, the depositing of the first conductive material can be performed by a low-resistivity tungsten (LRW) process.

In some embodiments, the removing of the first conductive material can performed by a reactive ion etching process or a wet etching process.

In some embodiments, the depositing of the second conductive material can be performed using a pulsed nucleation layer (PNL) process.

In some embodiments, the method can further comprise removing a part of the second conductive material by a chemical-mechanical planarization (CMP) process.

In some embodiments, the depositing of the first conductive material can be performed by a first process and the depositing of the second conductive material can be performed by a second process, the second process being different from the first process.

There is provided, in a second aspect, a device comprising a conductive structure disposed within a circuit structure including one or more layers over a substrate. The conductive structure can be provided by a gate or a contact structure. The conductive structure can include a first conductive layer and a second conductive layer disposed over the first conductive layer. The first conductive layer can comprise a first conductive material, such that at least a first portion of the first conductive material comprising grains having a size larger than a defined value. The second conductive layer can comprise a second conductive material, such that at least a second portion of the second conductive material comprising grains having a size less than the defined value.

In some embodiments, at least one of the first conductive material or the second conductive material can comprise tungsten.

In some embodiments, the first conductive material and the second conductive material can comprise the same conductive material.

In some embodiments, the size of a grain can be defined as the radius of the minimum sphere that fully contains the grain. Alternatively, the size of a grain can be defined as the size of the edge of the minimum cube that fully contains the grain, or as the smallest dimension of the grain, or as the median dimension of the grain, or as the largest dimension of the grain.

In some embodiments, the defined value can be at least 80 nm, 90 nm, or 100 nm.

In some embodiments, the first portion can be at least 50%, 70%, or 90%.

In some embodiments, the second portion can be at least 50%, 70%, or 90%.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 4A-4B schematically illustrate depositing a first layer of a conductive material within openings formed for fabricating a gate electrode or a contact structure, respectively;

FIGS. 6A-6B schematically illustrate depositing a second layer of a conductive material at least partially within the openings formed for fabricating a gate electrode or a contact structure, respectively;

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
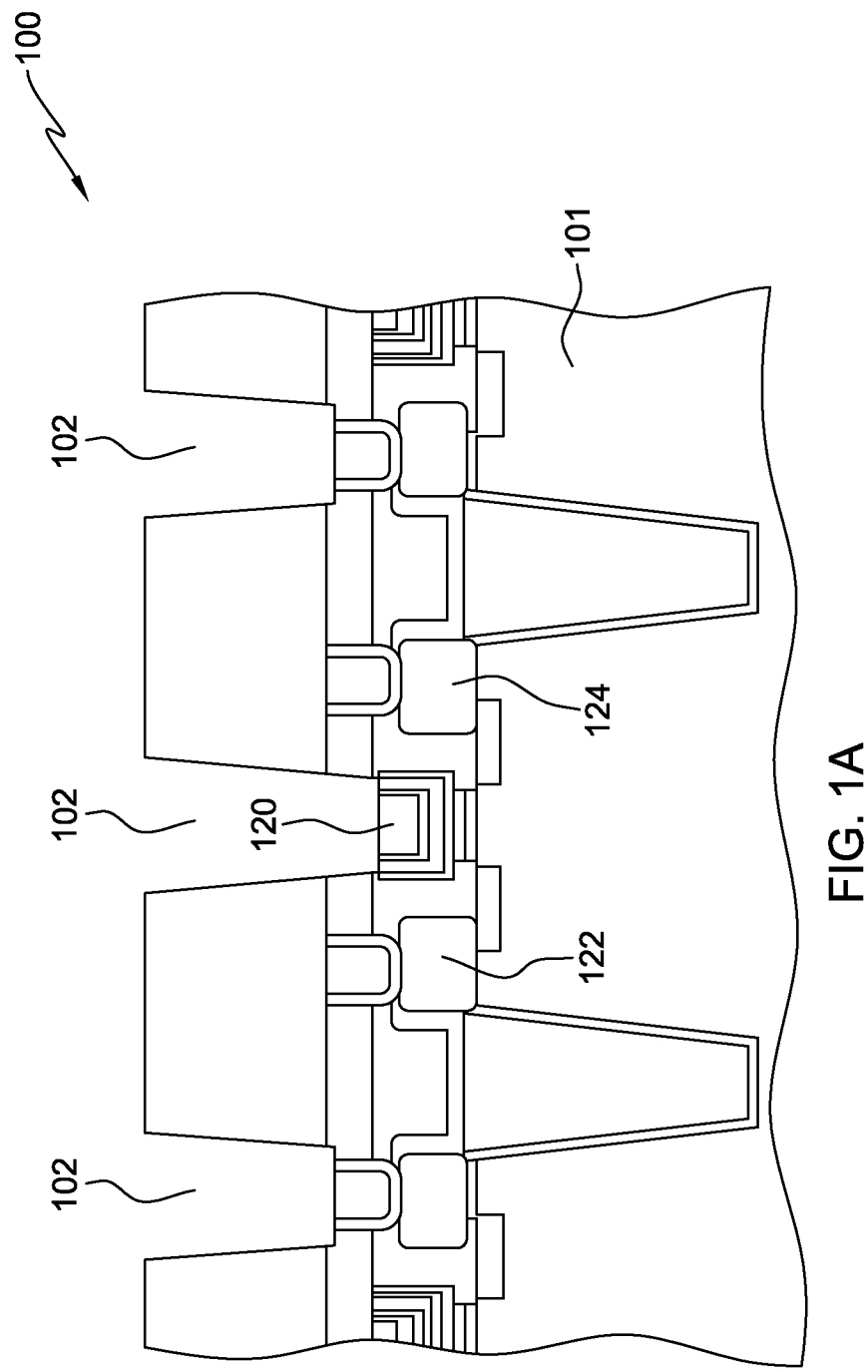
FIGS. 1A-1B schematically illustrate one example of an intermediate circuit structure attained during fabricating of contact structures of a conductive circuit.
Figure 1B:
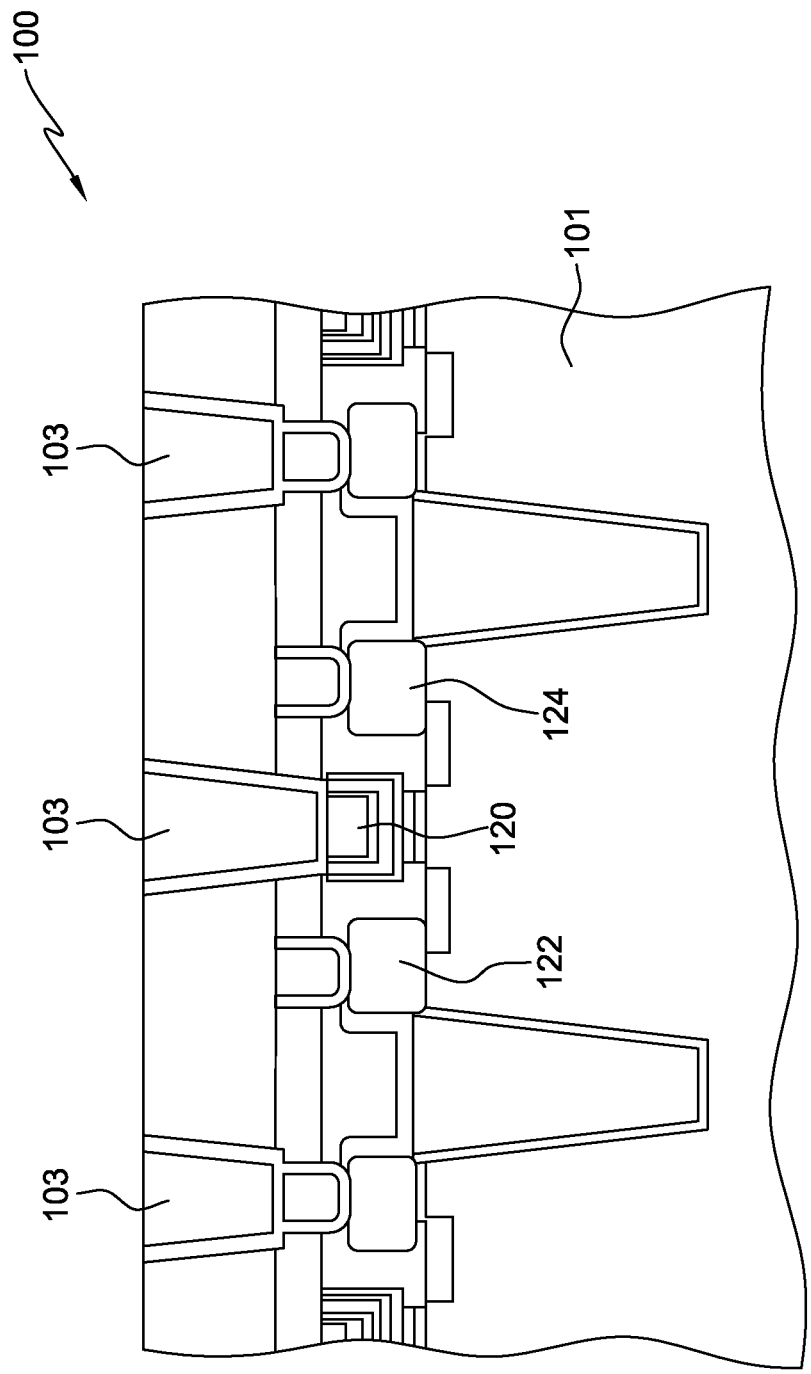

FIGS. 1A-1B schematically illustrate an intermediate circuit structure 100 which can be obtained during fabrication of a conductive circuit. The intermediate structure 100 can comprise a substrate 101 which can include, for example, a semiconductor material. The semiconductor material can comprise, e.g., silicon, germanium, a compound semiconductor material, a layered semiconductor material, a silicon-on-insulator (SOI) material, a SiGe-on-insulator (SGOI) material, and/or a germanium-on-insulator (GOI) material.

The intermediate structure 100 can further comprise one or more layers of conductive materials, dielectric materials, and/or semiconductor materials formed over substrate 101 using a variety a techniques, including, e.g., patterning by lithography and subsequent etching, for fabricating one or more elements of conductive circuits, such as, for example, a gate 120, a source 122, and a drain 124.

A plurality of openings 102 can be formed within the intermediate structure 100 using a variety a techniques, including, e.g., patterning by lithography and subsequent etching. One or more layers of a liner, e.g., titan nitride/titan (TiN/Ti) liner, can be deposited into the openings. The thickness of the liner layers may vary, depending upon the particular application. The openings 102 can then be filled with a conductive material, e.g., tungsten, using a variety of techniques, such as Low Resistivity Tungsten (LRW process) or Pulsed Nucleation Layer (PNLxT) process, followed by a Chemical Vapor Deposition (CVD) of tungsten (W) process (or CVD-W process). Finally, excessive conductive material can be removed using, e.g., Chemical-Mechanical Planarization (CMP) process, thus forming contacts 103, as schematically shown by FIG. 1B.

Figure 2:
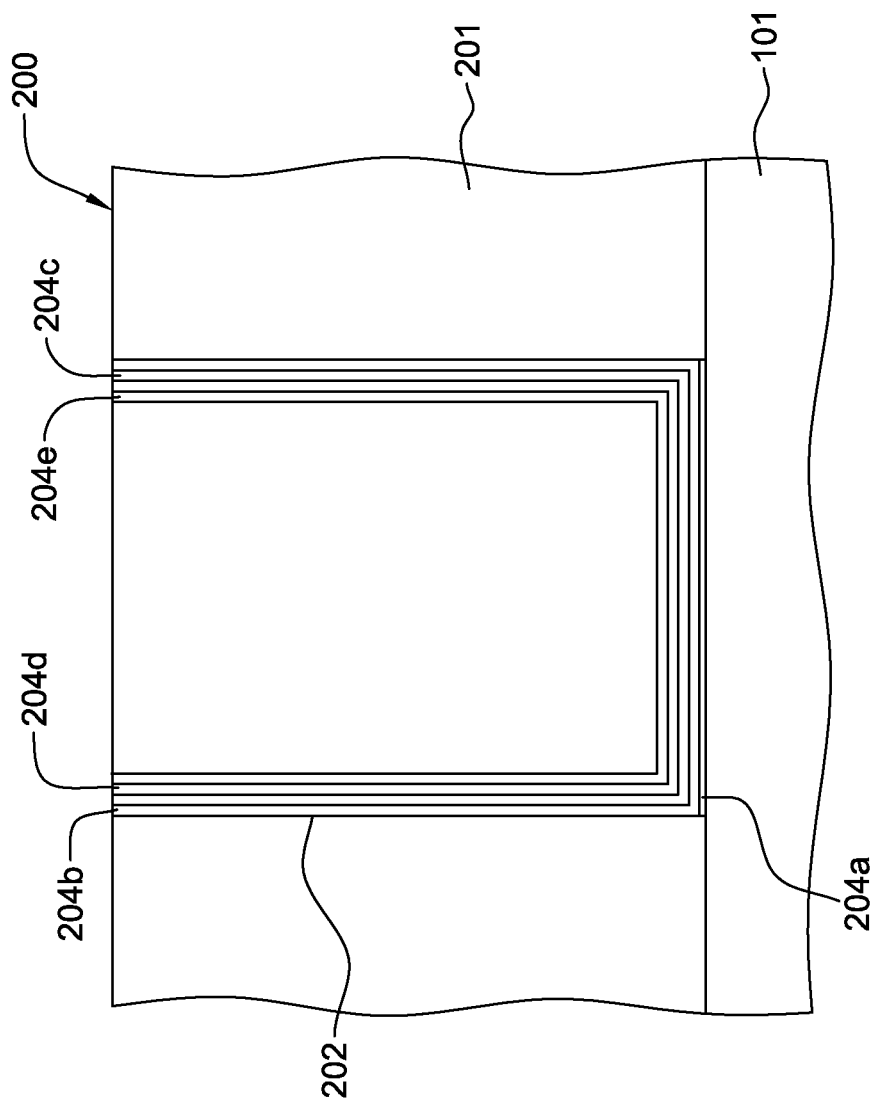
FIG. 2 schematically illustrates one example of an intermediate circuit structure attained during fabricating of gate electrodes of a semiconductor device.

A similar process can be employed for forming gates of semiconductor devices. FIG. 2 schematically illustrates an intermediate circuit structure 200 with an opening 202 formed for fabricating a gate of a semiconductor device. In the illustrative example of FIG. 2, the intermediate circuit structure 200 corresponds to an enlarged view of the gate area 120 of FIG. 1. In one example, the intermediate structure 200 can be employed in fabrication of an N-gate field effect transistor (FET). In another example, the intermediate structure 200 can be employed in fabrication of a P-gate FET.

Opening 202 can be formed within an interlayer dielectric 201 of intermediate structure 200, e.g., using a variety a techniques, including, e.g., patterning by lithography and subsequent etching. One or more layers comprising various materials can be deposited within the opening 202. In the illustrative example of FIG. 2, a chemox layer 204a can be deposited over the surface of substrate 101. A hafnium-based dielectric layer 204b comprising, e.g., hafnium oxide ($HfO_2$), hafnium silicate ($HfSiO_x$), and/or hafnium silicone oxynitride, ($HfSiON$) can be deposited over the chemox layer 204a. One or more metal-nitride layers 204c-204e can be deposited over the dielectric layer 204b, including, e.g., titan nitride (TiN) and/or tantalum nitride (TaN). Composition, number, and thickness of the layers 204a-204e may vary, depending upon the particular application.

Opening 202 can then be filled with a conductive material, e.g., tungsten, using a variety of techniques, such as an LRW process or a PNLxT process, followed by a CVD-W process. Finally, any excess conductive material can be removed by, e.g., CMP processing.

Figure 3A:
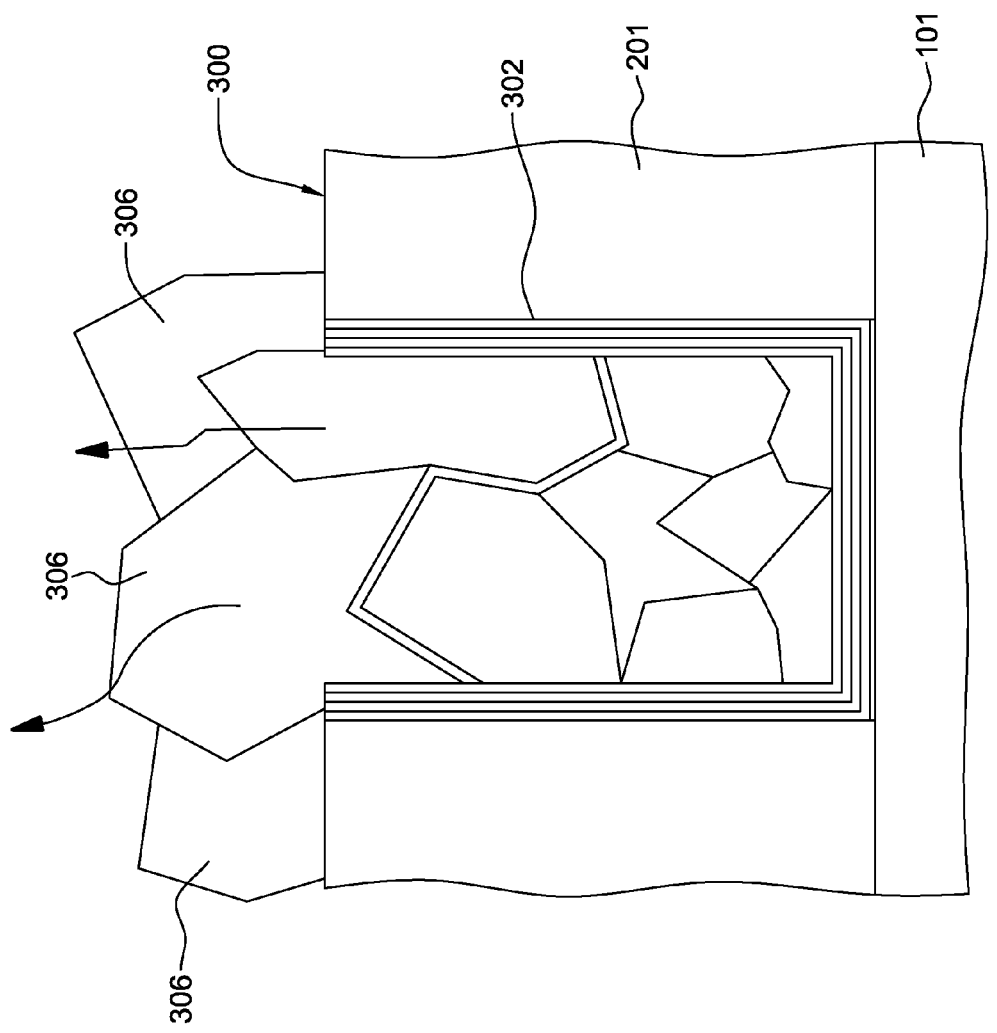
FIGS. 3B-3B schematically illustrate overfill and excessive removal by planarization of conductive material grains having relatively large size from an opening formed for fabricating a gate electrode or a contact structure, respectively.

Noticeable deficiencies are inherently present in the above described processes of forming contacts and gates of semiconductor devices. PNLxT process employed for filling the openings produces gates or contact structures having a relatively high electrical resistance, thus increasing the energy dissipation which can be highly undesirable in low power conductive circuits. Employing LRW process for filling the openings can yield gates or contact structures having significantly lower electrical resistance. However, due to relatively large size of conductive material grains produced by LRW process, and ensuing relatively poor adhesion of large grains to the liner, the subsequent CMP removal of excessive conductive material can lead to severe over-polishing by pulling out of large grains of conductive material, as schematically illustrated by FIGS. 3A-3B. Opening 302 formed within an intermediate structure 300 comprising a substrate 101 and interlayer dielectric 201 can be filled with a conductive material comprising relatively large grains 306. During the planarization process, removal of large grains of the conductive materials can produce a recess or hollow space 308 within opening 302, as schematically illustrated by FIG. 3B, thus rendering the gate or contact structure being formed potentially dysfunctional.

To overcome the above noted deficiencies, there is in one aspect provided herein a process which includes depositing two layers of conductive material with an intermediate planarization step. The process can be employed for forming gates or contact structures of a conductive circuit.

The process can comprise forming an opening within an intermediate structure employed in fabrication of a conductive circuit. The intermediate structure can comprise a plurality of layers, including one or more semiconductor layers, one or more conductive layers, and/or one or more dielectric layers. FIG. 4A schematically illustrates an intermediate structure 400a comprising a substrate 101 and interlayer dielectric 201, and having an opening 201 intended for fabricating a gate of a semiconductor device. FIG. 4B schematically illustrates an intermediate structure 400b comprising a substrate 101 and interlayer dielectric 201, and having an opening 201 intended for fabricating a contact of a conductive circuit.

The process can further comprise depositing within opening 201 one or more layers comprising various materials. In the illustrative example of FIG. 4A, a chemox layer 404a can be deposited over the surface of substrate 101. A hafnium-based dielectric layer 404b comprising, e.g., hafnium oxide ($HfO_2$), hafnium silicate ($HfSiO_x$), and/or hafnium silicone oxynitride, (HfSiON) can be deposited over the chemox layer 404a. One or more metal-nitride layers 404c-404e can be deposited over the dielectric layer 404b, including, e.g., titan nitride (TiN) and/or tantalum nitride (TaN). The thickness of the layers 404a-404e may vary, depending upon the particular application.

The process can further comprise depositing a first conductive material within opening 201, which can be performed employing variety of techniques. In one example, the first conductive material can comprise tungsten. In another example, the first conductive material can comprise other metals.

In one example, the depositing can be accomplished using LRW process. LRW process comprises growing a nucleation film by delivering pulsed gases to the working surface, followed by a higher-temperature treatment of the film to create a large grain template, which would enable growing relatively large grains by subsequent CVD-W processing.

As schematically illustrated by FIGS. 4A-4B, the first layer 406 of the conductive material deposited within the opening can comprise grains of various sizes. While grains can have various irregular shapes, their sizes can be described using a characteristic metric independent of the shape variations. Thus, in one example, size of a grain can be defined as the radius of the minimum bounding sphere, i.e., the minimum sphere that fully contains the grain. In another example, the size of a grain can be defined as the size of the edge of the minimum bounding cube, i.e., the minimum cube that fully contains the grain. In another example, the size of a grain can be defined as the smallest dimension of the grain, or as the median dimension of the grain, or as the largest dimension of the grain.

In one example, at least a portion of the deposited first layer of the conductive material can comprise grains having the size larger than a first value, e.g., 80 nm, 90 nm, or 100 nm. In a further aspect, the portion can be provided by at least 50%, 70%, or 90% of the deposited conductive material.

In another example, at least a portion of the deposited first layer of the conductive material can comprise grains having the size falling within the range from a first value to a second value, e.g., from 80 nm to 150 nm, from 90 nm to 200 nm, or from 100 nm to 300 nm. In a further aspect, the portion can be provided by at least 50%, 70%, or 90% of the deposited conductive material.

The process can further comprise removing a part of the conductive material from within the opening, which may be performed employing variety of techniques. In one example, the removal may be accomplished using Reactive Ion Etching (RIE) processing which employs chemically reactive plasma to remove the unwanted material. The plasma can be generated under low pressure by an electromagnetic field. High-energy ions from the plasma can come in contact with the surface of the material to be removed. Plasma can be created within the system by applying a strong RF (radio frequency) electromagnetic field. The oscillating electric field can ionize the gas molecules by stripping them of electrons, creating plasma. In each cycle of the electromagnetic field, the electrons can be electrically accelerated up and down in the process chamber, sometimes striking both the upper wall of the chamber and the surface of the conductive material. At the same time, the much more massive ions can move relatively little in response to the RF electric field. When electrons are absorbed into the process chamber walls they can be fed out to ground and thus do not alter the electronic state of the system. However, electrons stripped from the surface of the conductive material can build up its charge due to the DC isolation of the conductive material. This charge build up can develop a large positive voltage on the surface of the conductive material. The plasma itself can develop a slightly negative charge due to the higher concentration of negative ions compared to free electrons. Because of the large voltage difference, negative ions can drift toward the surface of the conductive material. The ions can react chemically with the surface of the conductive material, and can also sputter some material by transferring some of their kinetic energy.

In another example, the removal of excessive conductive material may be accomplished using a wet etching process. The intermediate structure can be immersed into a bath of etchant, which can be agitated to achieve better process timing. Various etchants can be employed depending upon the particular application. Employing wet etchants can result in disposal of large amounts of toxic waste. As an alternative to immersion, a gas (e.g., nitrogen) can be employed to cushion and protect one side of the intermediate structure while etchant is applied to the other side.

Figure 5A:
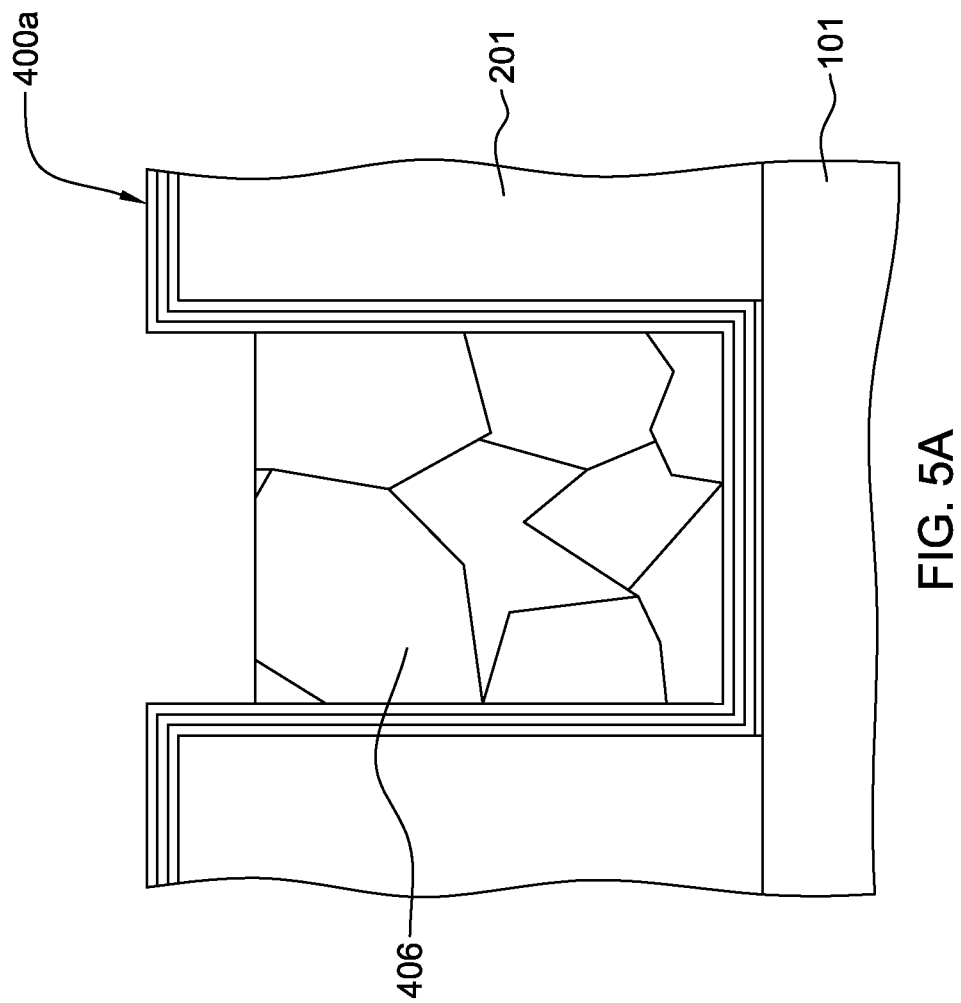
FIGS. 5A-5B schematically illustrate partial removal of the first layer of a conductive material from within the openings formed for fabricating a gate electrode or a contact structure, respectively.
Figure 5B:
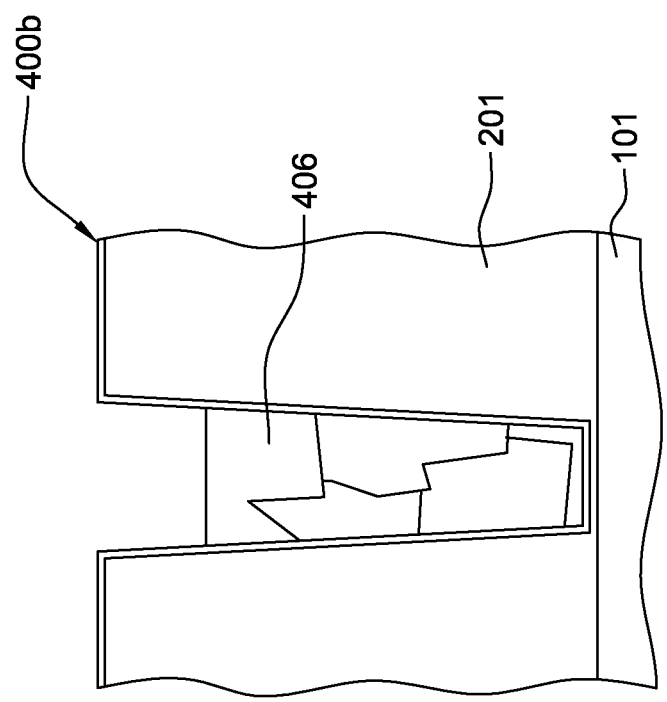

FIGS. 5A-5B illustrate, by way of example only, the intermediate structures 400a-400b after the removal of a part of the conductive material. In one example, less than 30% of the conductive material can be removed from within the opening. In another example, at least 10% of the height of the opening can be exposed as the result of removal of the conductive material.

The process can further comprise depositing a second conductive material within the opening, which can be performed employing variety of techniques. In one example, the second conductive material can comprise tungsten. In another example, the second conductive material can comprise other metals. In another example, the first and the second conductive materials can comprise the same conductive material. In another example, the first and the second conductive materials can comprise different conductive materials.

In one example, the depositing can be accomplished using PNLxT process. PNLxT process is an advanced tungsten nucleation process designed to reduce effective feature resistivity by reducing the nucleation film thickness. PNLxT process employs a nucleation sequence to reduce PNL growth rates and enhance nucleation conformity for very thin films. By reducing the nucleation thickness, more volume of the working surface can be occupied by the low-resistivity bulk tungsten film, thus reducing the overall resistance of the gate or contact structure. In some embodiments, the PNLxT process can be followed by a CVD-W process.

Figure 6B:
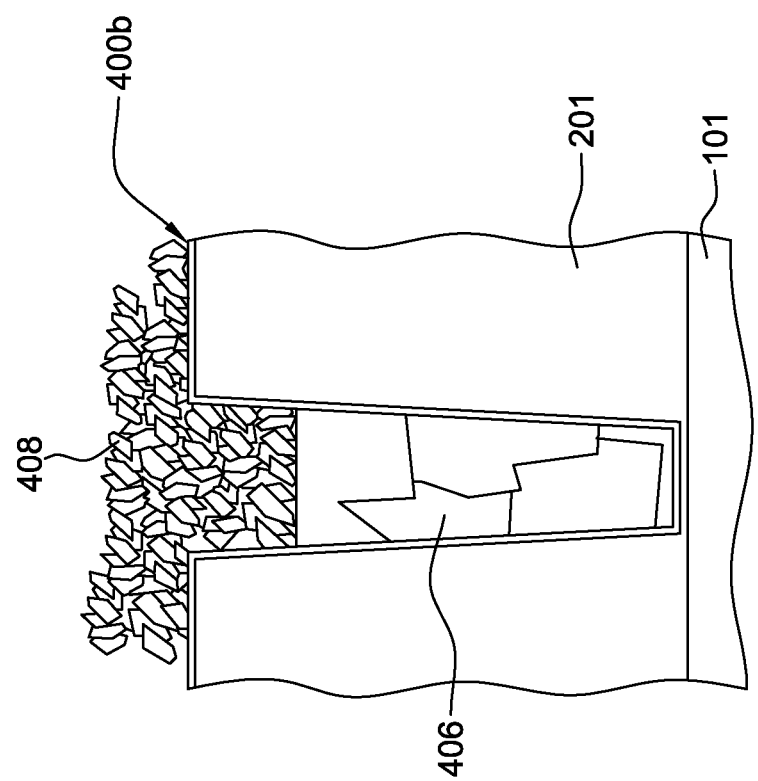

FIGS. 6A-6B illustrate, by way of example only, intermediate structures 400a-400b after the depositing of the second layer of the conductive material. As schematically illustrated by FIGS. 6A-6B, the second layer conductive material 408 can comprise grains of various sizes. In one example, at least a portion of the second layer of the conductive material can comprise the grains having the size smaller than the first value defined herein above as the upper boundary of the size of the grains comprised by the first layer of the conductive material. In a further aspect, the portion can be provided by at least 50%, 70%, or 90% of the second layer of the conductive material.

In another example, at least a portion of the deposited second layer of the conductive material can comprise grains having the size falling within the range from a third value to a fourth value, e.g., from 10 nm to 40 nm, from 20 nm to 50 nm, or from 30 nm to 70 nm. In some embodiments, the fourth value i.e., the upper boundary of the size of the grains comprised by the second layer of the conductive material, can be less than the first value defined herein above, i.e., the upper boundary of the size of the grains comprised by the first layer of the conductive material. In a further aspect, the portion can be provided by at least 50%, 70%, or 90% of the deposited conductive material.

The process can further comprise removing a part of the second layer of the conductive material from within the opening which may be performed employing variety of techniques. In one example, the removal may be accomplished using CMP process.

CMP process employs two competing particle removal mechanisms. One is wet etching, in which an oxidant reacts with the conductive material to form a metal oxide that is soluble in a slurry solution. The other removal mechanism employed in CMP is a combination of chemical and mechanical processes. The oxidant forms a strong metal oxide thus protecting metal surface from further oxidation. Mechanical abrasion from particles in the slurry removes the passivation metal oxide and exposes the metal surface to further oxidation and oxide removal process. In one example, fine alumina powder can be used in the CMP slurry, and potassium ferrocyanide, $K_3Fe(CN)_6$, can be used as both etching agent and oxidant.

Figure 7A:
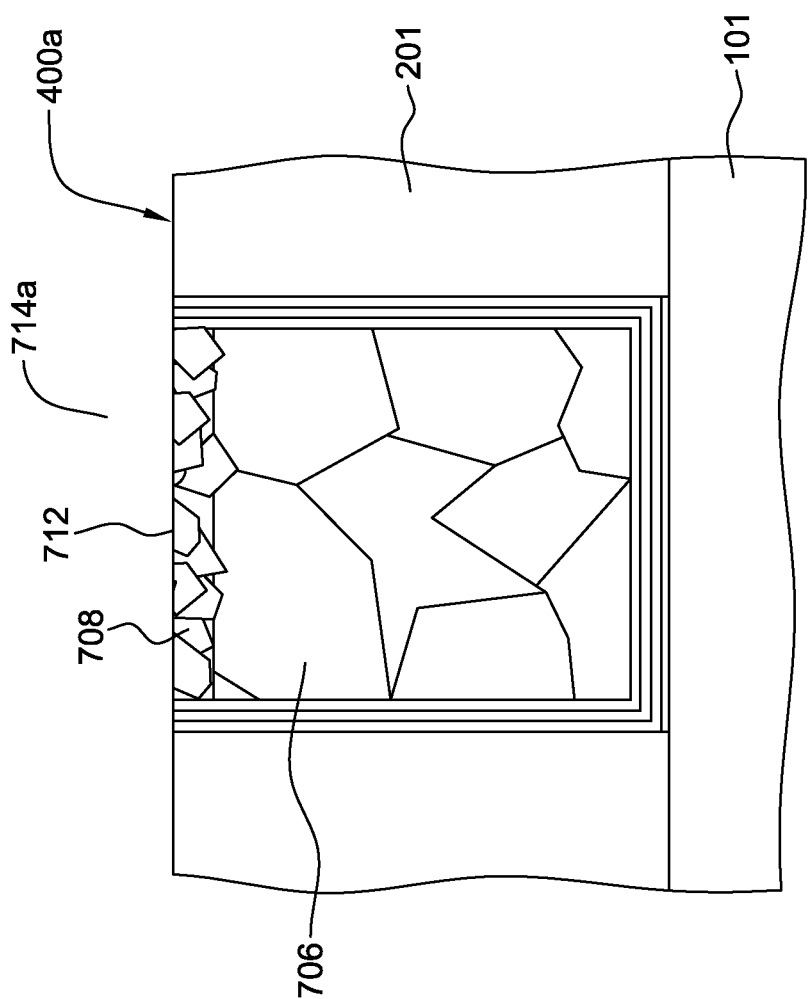
FIGS. 7A-7B schematically illustrate planarization of the second layer of a conductive material within the openings formed for fabricating a gate electrode or a contact structure, respectively.
Figure 7B:
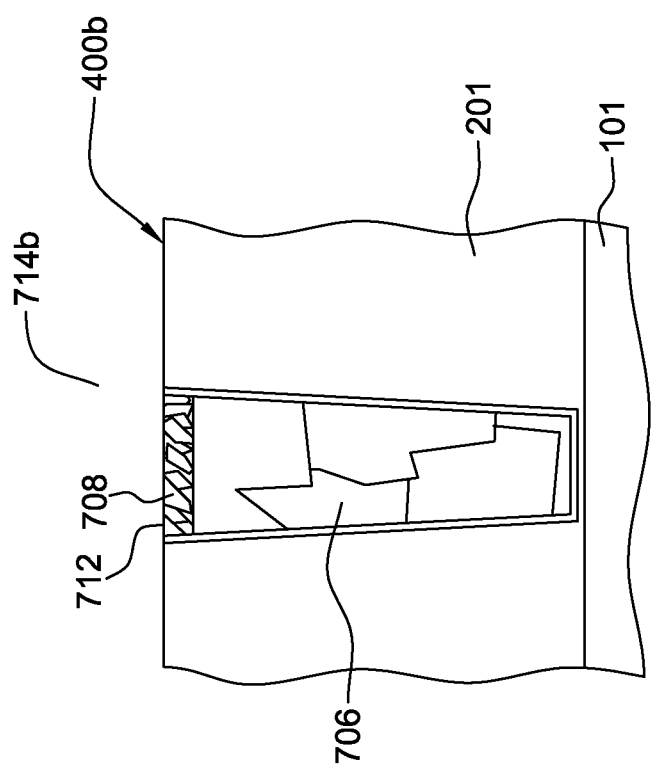

FIGS. 7A-7B illustrate, by way of example only, the intermediate structures 400a-400b after the removal of a part of the second layer of the conductive material. Due to the relatively small size of the grains composing the second layer of the conductive material, the CMP process provides a desirably high degree of planarization of the surface 712 of a gate or a contact.

Figure 8:
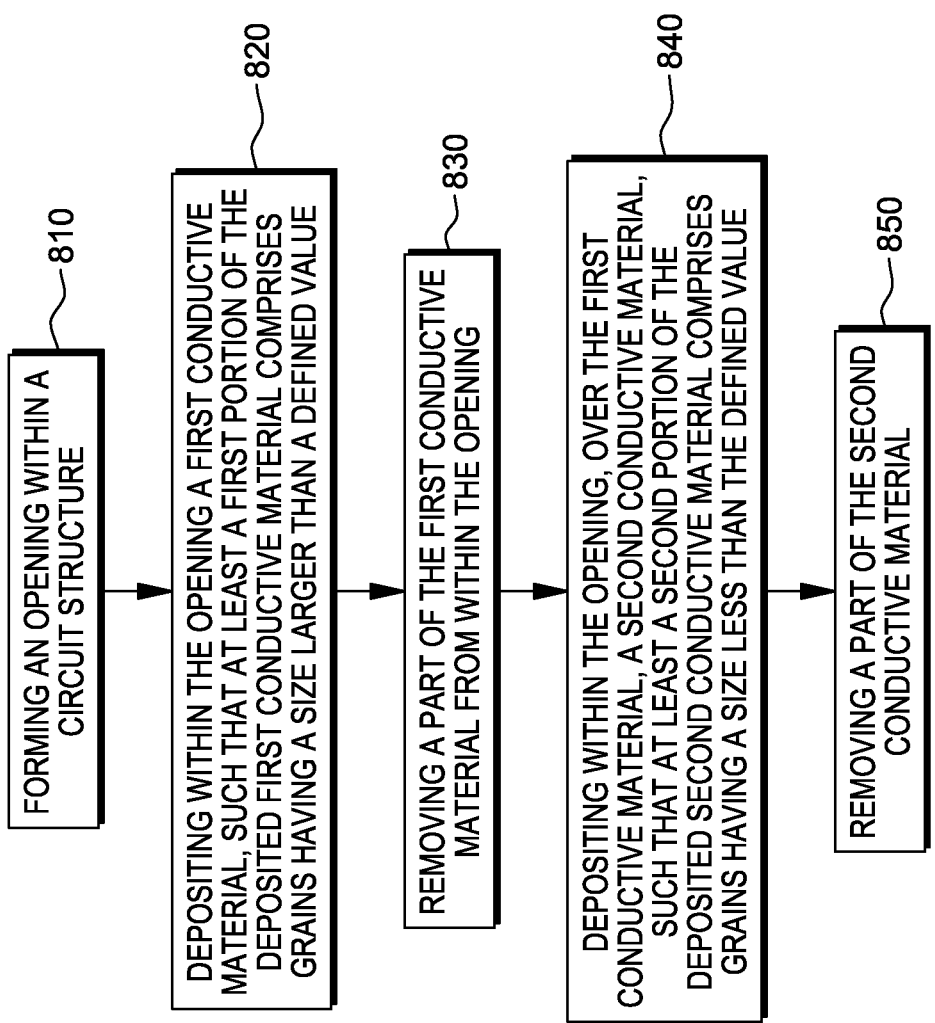
FIG. 8 depicts a flowchart of one illustrative embodiment of a method of forming a gate electrode or a contact structure, in accordance with one or more aspects of the present invention.

The detailed description presented herein above can be further illustrated by FIG. 8 depicting a flowchart of one illustrative embodiment of the above described method of fabricating a gate or a contact structure s of a conductive circuit. In the illustrative embodiment, the method can comprise forming an opening within a circuit structure, as illustrated by rectangle 810. The method can further comprise depositing within the opening a first conductive material, as illustrated by rectangle 820, such that at least a first portion of the deposited first conductive material comprises grains having a size larger than a defined value. The method can further comprise removing a part of the first conductive material from within the opening, as illustrated by rectangle 830. The method can further comprise, depositing within the opening, over the first conductive material, a second conductive material, as illustrated by rectangle 840, such that at least a second portion of the deposited second conductive material comprises grains having a size less than the defined value. The method can further comprise removing a part of the second conductive material, as illustrated by rectangle 850.

The above described method advantageously allows completely fill with a conductive material an opening formed for fabricating a gate or a contact structure achieving a high degree of planarization of the surface of the gate or contact structure, and at the same time maintaining a low resistance of the resulting gate or contact structure.

In another aspect, there is provided a device comprising a conductive structure disposed within a circuit structure 400a-400b including one or more layers over a substrate 101, as schematically illustrated by FIGS. 7A-7B. The conductive structure can comprise a gate 714a or a contact structure 714b. The conductive structure can include a first conductive layer 706 comprising a first conductive material. At least a first portion of the first conductive material can comprise grains having a size larger than a defined value. The conductive structure can further include a second conductive layer 708 disposed over the first conductive layer 706, the second conductive layer comprising a second conductive material. At least a second portion of the second conductive material can comprise grains having a size less than the defined value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. A method comprising:
   forming a conductive structure, the forming comprising:
      forming an opening within a circuit structure, the circuit structure comprising one or more layers over a substrate;
      depositing a first conductive material within the opening, wherein at least a first portion of the deposited first conductive material comprises first material grains having a size larger than a defined value;
      removing a part of the first conductive material from within the opening to expose an outer portion of the opening; and
      depositing a second conductive material over the first conductive material, within the exposed outer portion of the opening, wherein at least a second portion of the deposited second conductive material comprises second material grains having a size less than the defined value.

2. The method of claim 1, wherein the conductive structure comprises one of a gate electrode or a contact structure.

3. The method of claim 1, wherein the first portion comprises one of at least 50%, at least 70%, or at least 90%.

4. The method of claim 1, wherein the second portion comprises one of at least 50%, at least 70%, or at least 90%.

5. The method of claim 1, wherein size of a grain is defined as one of a radius of a minimum sphere that fully contains the grain, a size of an edge of a minimum cube that fully contains the grain, a smallest dimension of the grain, a median dimension of the grain, or a largest dimension of the grain.

6. The method of claim 1, wherein the defined value comprises one of at least 80 nm, at least 90 nm, or at least 100 nm.

7. The method of claim 1, wherein at least one of the first conductive material or the second conductive material comprises tungsten.

8. The method of claim 1, wherein the first conductive material and the second conductive material comprise the same conductive material.

9. The method of claim 1, wherein the depositing of the first conductive material is performed by a low-resistivity tungsten (LRW) process.

10. The method of claim F, wherein the removing of the first conductive material is performed by one of a reactive ion etching process or a wet etching process.

11. The method of claim 1, wherein the depositing of the second conductive material is performed using a pulsed nucleation layer (PNL) process.

12. The method of claim 1, further comprising removing a part of the second conductive material by a chemical-mechanical planarization (CMP) process.

13. The method of claim 1, wherein the depositing of the first conductive material is performed by a first process and the depositing of the second conductive material is performed by a second process, the second process being different from the first process.

14. A device comprising:
a conductive structure of a circuit structure including one or more layers over a substrate, the conductive structure being disposed within an opening in the circuit structure and comprising one of a gate electrode or a contact structure, and including:
a first conductive layer disposed within the opening and comprising a First conductive material, at least a first portion of the first conductive material comprising first material grains having a size larger than a defined value; and
a second conductive layer disposed on the first conductive layer within the opening, the second conductive layer comprising a second conductive material, and at least a second portion of the second conductive material comprises second material grains having a size less than the defined value.

15. The device of claim 14, wherein at least one of the first conductive material and the second conductive material comprises tungsten.

16. The device of claim 14, wherein the first conductive material and the second conductive material comprise the same conductive material.

17. The device of claim 14, wherein size of a grain is defined as one of a radius of a minimum sphere that fully contains the grain, a radius of a minimum cube that fully contains the grain, a smallest dimension of the grain, a smallest dimension of the grain, or a largest dimension of the grain.

18. The device of claim 14, wherein the defined value comprises one of at least 80 nm, at least 90 nm, or at least 100 nm.

19. The device of claim 14, wherein the first portion comprises one of at least 50%, at least 70%, or at least 90%.

20. The device of claim 14, wherein the second portion comprises one of at least 50%, at least 70%, or at least 90%.

* * * * *

UNITED STATES PATENT AND TRADEMARK OFFICE
CERTIFICATE OF CORRECTION

PATENT NO. : 8,859,417 B2  
APPLICATION NO. : 13/733282  
DATED : October 14, 2014  
INVENTOR(S) : Yu et al.

Page 1 of 1

It is certified that error appears in the above-identified patent and that said Letters Patent is hereby corrected as shown below:

In The Claims

Column 9, Line 27: Claim 10, Delete "claim F," and insert --claim 1,--

Signed and Sealed this
Twentieth Day of January, 2015

Michelle K. Lee
*Deputy Director of the United States Patent and Trademark Office*